United States Patent [19]

Watanabe

[11] Patent Number: 5,309,008
[45] Date of Patent: May 3, 1994

[54] SEMICONDUCTOR MEMORY DEVICE HAVING A TRENCH CAPACITOR

[75] Inventor: Toshiharu Watanabe, Yokohama, Japan

[73] Assignee: Kabushiki Kaisha Toshiba, Kawasaki, Japan

[21] Appl. No.: 22,280

[22] Filed: Feb. 25, 1993

[30] Foreign Application Priority Data

Sep. 9, 1991 [JP] Japan ................. 3-229113

[51] Int. Cl.5 ............... H01L 29/68; H01L 29/78; H01L 29/92
[52] U.S. Cl. ................. 257/304; 257/301; 257/303; 257/305; 257/622; 257/901
[58] Field of Search ............ 257/301, 303, 305, 304, 257/622, 901

[56] References Cited

U.S. PATENT DOCUMENTS

| 4,794,434 | 12/1988 | Pelley | 257/301 |
|---|---|---|---|
| 4,801,988 | 1/1989 | Kenney | 257/305 |
| 4,801,989 | 1/1989 | Taguchi | 257/305 |
| 4,803,535 | 2/1989 | Taguchi | 257/301 |
| 4,967,248 | 10/1990 | Shimizu | 257/305 |
| 4,969,022 | 11/1990 | Nishimoto et al. | 257/301 |

FOREIGN PATENT DOCUMENTS

| 62-219560 | 9/1987 | Japan | 257/301 |
|---|---|---|---|
| 1-160047 | 6/1989 | Japan | 257/303 |
| 2-106958 | 4/1990 | Japan | 257/301 |
| 2199696 | 7/1988 | United Kingdom | 257/301 |

OTHER PUBLICATIONS

"A 4.2um² Half-$V_{cc}$ Sheath-Plate Capacitor DRAM Cell with Self-Aligned Buried Plate-Wiring", T. Kaga et al., Central Research Laboratory, Hitachi, Ltd. Kakubunji, Tokyo 135, Japan, 1987.

Primary Examiner—Ngan Ngo
Attorney, Agent, or Firm—Banner, Birch, McKie & Beckett

[57] ABSTRACT

A p-type silicon substrate is arranged on an n-type silicon substrate and a trench is formed in the p-type silicon substrate. An insulating film for separating elements from the other is formed along the upper side wall of the trench. A diffusion layer which serves as a capacitor electrode, and a capacitor insulating film are formed in the substrate along the lower side wall of the trench. A storage electrode is formed in the trench. This storage electrode is connected to a diffusion layer of MOSFET via the electrode and the diffusion layer. Even when the diameter of the trench is made small, the surface area of the storage electrode can be kept large enough because the diffusion layer which serves as the capacitor electrode is formed in the substrate along the side wall of the trench.

12 Claims, 5 Drawing Sheets

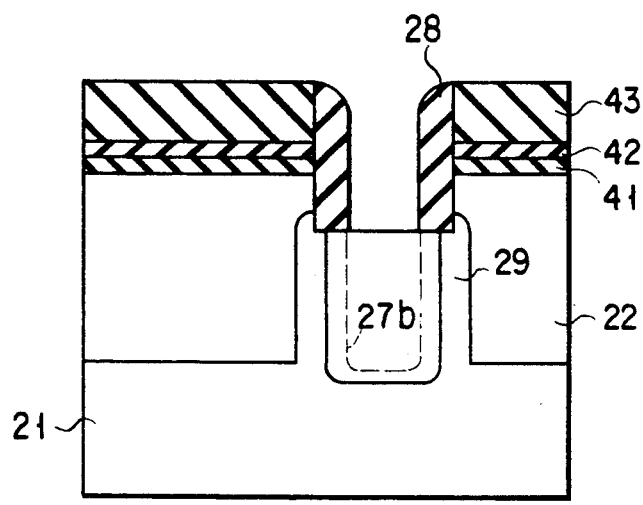
F I G. 4
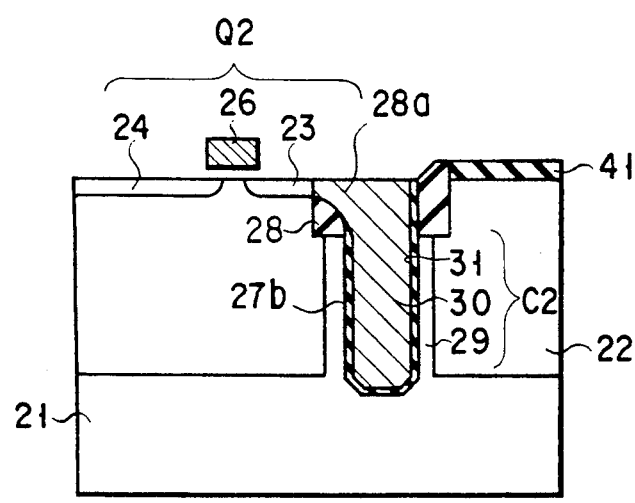
F I G. 5

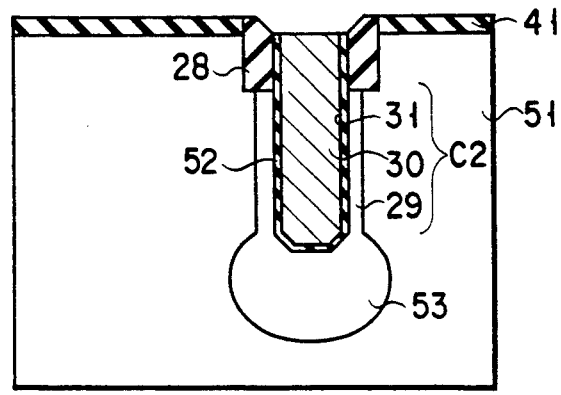
F I G. 6
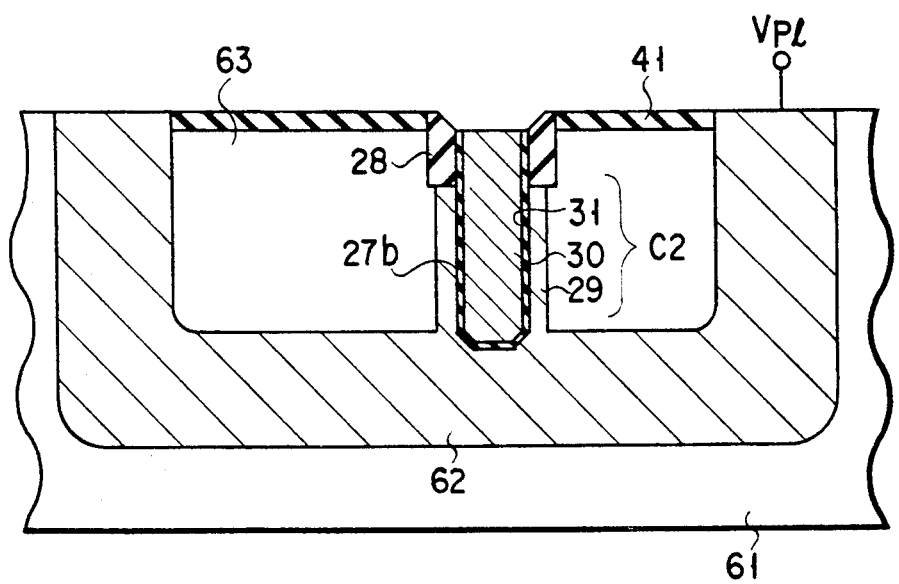
F I G. 7

SEMICONDUCTOR MEMORY DEVICE HAVING A TRENCH CAPACITOR

BACKGROUND OF THE INVENTION

1. Field of the Invention

The present invention relates to a semiconductor memory device such as the DRAM (dynamic random access memory) and, more particularly, it relates to a memory device of the trench-capacitor type.

2. Description of the Related Art

FIG. 1 shows an example of the conventional DRAM cells and this DRAM cell was made public at IEDM in 1987 and it was also disclosed in a paper titled "A 4.2 $\mu m^2$ Half-Vcc Sheath-Plate Capacitor DRAM Cell with Self-Aligned Buried Plate-Wiring".

A MOS transistor Q1 which serves as a selection transistor comprises a gate or word line 11, and diffusion layers 12, 13. A bit line 14 is connected to the diffusion layer 13 and a storage electrode 15 which forms a capacitor C1 is connected to the diffusion layer 12. The capacitor C1 comprises the storage electrode 15, an insulating film 16 enclosing the storage electrode 15, and a capacitor electrode 17 enclosing the insulating film 16. An insulating film 18 is arranged round the capacitor electrode 17. These insulating film 18 and capacitor C1 are arranged in a trench 19 formed in a silicon substrate (not shown). The capacitor electrode 17 is connected to an impurities layer 20 embedded in the silicon substrate.

When data is to be memorized in the capacitor C1 in the case of the above-described arrangement, potential supplied to the bit line 14 is transmitted to the diffusion layer 13. When the word line 11 is selected under this state, the potential transmitted to the diffusion layer 13 is further transmitted to the storage electrode 15 via the diffusion layer 12 and stored in the capacitor C1. On the other hand, the data stored in the capacitor C1 is transmitted to the bit line 14 via the diffusion layers 12 and 13 when the word line 11 is selected.

In the case of the above-described device, the insulating film 18 is formed on the inner face of the trench 19, and the capacitor electrode 17, insulating film 16 and storage electrode 15 are formed in this order on the inner face of the insulating film 18. When the insulating film 18 is formed 0.05 $\mu m$ thick, the capacitor electrode 17 formed 0.1 $\mu m$ thick, and the insulating film 16 is made negligible because it is quite thin in a case where the diameter of the trench 19 is 0.4 $\mu m$, therefore, the diameter of the storage electrode 15 becomes as follows:

$$0.4 - (0.05 + 0.1) \times 2 = 0.1 \ \mu m$$

As the result, the surface area of the capacitor section becomes so small as not to sufficiently store charges therein.

SUMMARY OF THE INVENTION

The present invention is therefore intended to eliminate the above-mentioned drawback. Accordingly, the object of the present invention is to provide a semiconductor memory device of the trench-capacitor type enabling the capacitor to have a surface area large enough to store charges therein.

According to the present invention, there can be provided a semiconductor memory device comprising: a main region which is a semiconductor of a first conductive type; a trench formed extending from a top surface of the main region into it and comprising a first portion on a lower side and a second portion on an upper side; a first insulating film covering the inner surface of the first portion of the trench; an impurity diffusion layer of a second conductive type formed in the main region, contacting with the circumferential surface of the first insulating film, serving as a capacitor electrode, and being connected to a reference potential; a second insulating film covering the inner surface of the second portion of the trench and having a film thickness larger than that of the first insulating film; a conductive body contained in the trench and serving as a storage electrode; a transfer MOSFET arranged on the main region; connecting means for connecting one of the source and drain of the MOSFET to conductive body; a bit line connected to the other of the source and drain of the MOSFET; and a word line connected to the gate of the MOSFET.

According to the present invention, the first insulating film and part of the storage electrode are formed in the trench along the side wall of the lower portion thereof. while the second insulating film and another part of the storage electrode are formed in the trench along the side wall of the upper portion thereof. Even when the diameter of the trench is made small, therefore, the diameter of the storage electrode can be made so large as to keep the surface area of the capacitor large enough.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4 is a sectional view showing how a semiconductor memory device according to second embodiment of the present invention is made;

FIG. 5 is a sectional view showing how a semiconductor memory device according to a third embodiment of the present invention is made;

FIG. 6 is a sectional view showing how a semiconductor memory device according to a fourth embodiment of the present invention is made; and FIG. 7 is a sectional view showing how a semiconductor memory device according to a fifth embodiment of the present invention is made.

DETAILED DESCRIPTION OF THE PREFERRED EMBODIMENTS

Figure 1:
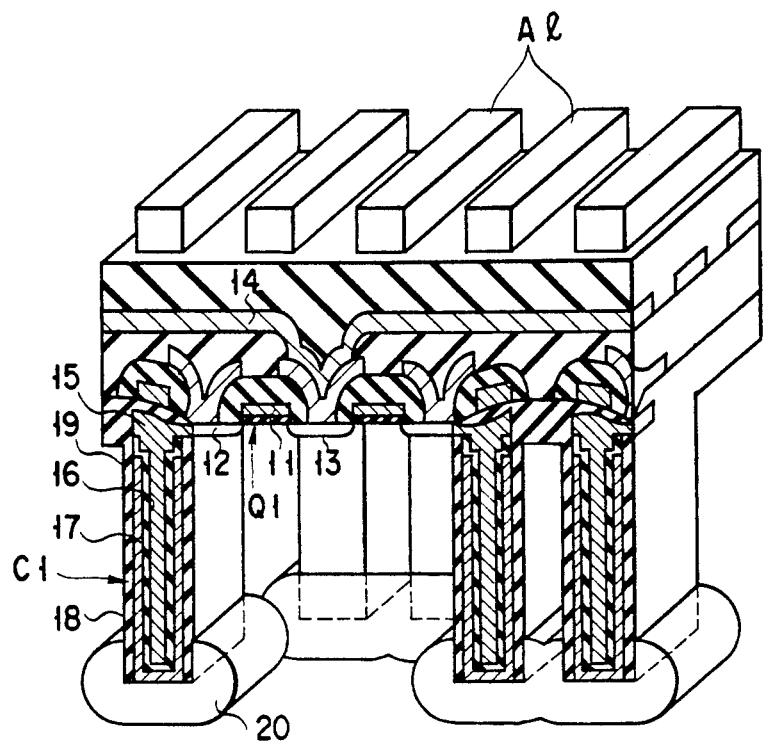
FIG. 1 is a perspective view showing part of a conventional semiconductor memory device.
Figure 2:
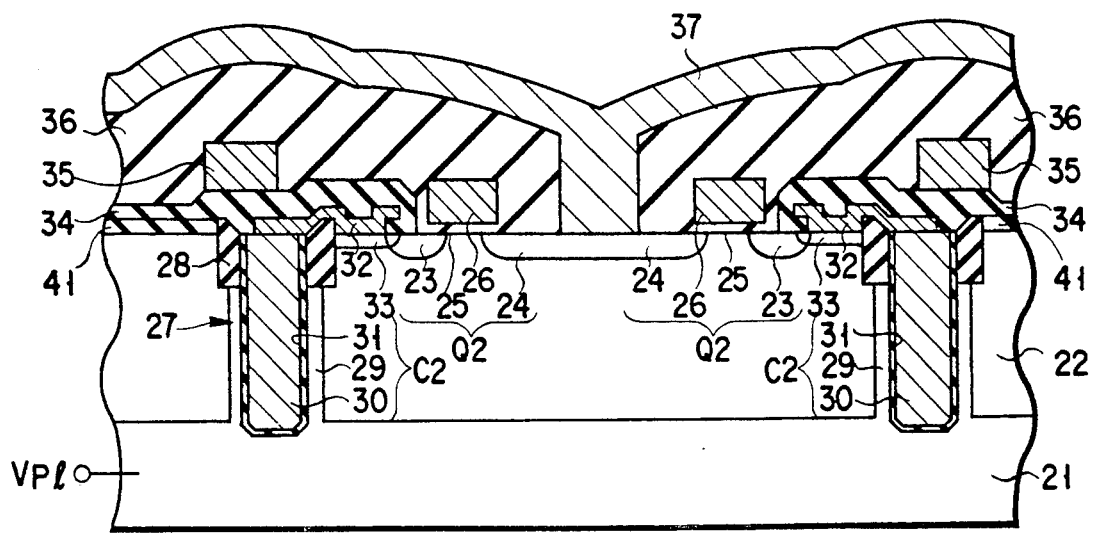
FIG. 2 is a sectional view showing part of a semiconductor memory device according to a first embodiment of the present invention.

A first embodiment of the present invention shown in FIG. 2 is a DRAM of the one transistor to one capacitor type.

A p-type silicon substrate 22 is arranged on an n-type silicon substrate 21. Diffusion layers 23 and 24 of the n-type which form a transistor (or MOSFET) Q2 are arranged in the p-type silicon substrate 22. An insulating film 25 is arranged on the p-type silicon substrate 22 and a gate electrodes 26 which serve as a word line is arranged on the insulating film 25.

A trench 27 is arranged in the p-type silicon substrate 22. It comprises a first portion on the lower side and a second portion on the upper side. When cross-sectioned at those areas which are defined by the inner face of the first portion and by that of the second one, they are circles and the circular area of the first portion is smaller in dimension than that of the second one.

An insulating film 28 is formed along the side wall of the trench 27 in the substrate 22 and at the second portion and it serves as an element-separating region. The cross sectional area of this region which is defined by the inner face of the insulating film 28 is circular and substantially the same as that of the first portion. A diffusion layer 29 which serves as a capacitor electrode connected to the n-type silicon substrate 21 is formed along the side wall of the trench 27 in the substrate 22 and under the insulating film 28. An n-type storage electrode 30 is formed in the trench 27 and a capacitor insulating film 31 is arranged between the storage electrode 30 and the diffusion layer 29. The storage electrode 30, capacitor insulating film 31 and diffusion layer 29 form a capacitor C2.

An end of a connection electrode 32, made of metal, metal silicide, or polycrystal Si, is arranged on the storage electrode 30. The other end thereof is connected to an n-type diffusion layer 33 in the p-type silicon substrate. The diffusion layer 33 is connected to the diffusion layer 23. An insulating layer 34 is formed on the electrode 32 and a word line 35 connected to other memory cells is arranged on the insulating layer 34. An insulating layer 36 is formed on all of them and a bit line 37 is arranged on the insulating layer 36. A reference potential $V_{p}1$ for the capacitor is supplied to the n-type silicon substrate 21.

When arranged as described above, the device enables potential supplied to the bit line 37 to be transmitted to the diffusion layer 24. When the word line 26 is selected under this state, the potential transmitted to the diffusion layer 24 is supplied to the storage electrode 30 via the diffusion layers 23, 33 and the electrode 32 and memorized by the capacitor C2. Data thus memorized by the capacitor C2 is read into the bit line 37 by a process reverse to the above-described one.

Referring to FIGS. 3A through 3F, it will be described how the above-described semiconductor memory device is made, and the same components as those shown in FIG. 2 will be denoted by the same reference numerals.

Figure 3A:
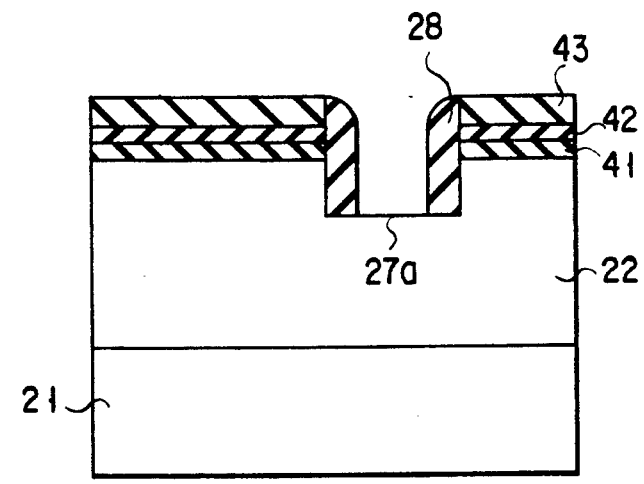
FIGS. 3A through 3F are sectional views showing how the semiconductor memory device shown in FIG. 1 is made.

As shown in FIG. 3A, the p-type silicon substrate 22 is formed on the n-type silicon substrate 21. A silicon oxide film 41 is formed on the substrate 22 and a silicon nitride film 42 on the silicon oxide film 41. An oxide film 43 is deposited on the silicon nitride film 42 according to a CVD method. Using the oxide film 43 as a mask, a trench 27a of shallow depth is then formed extending into the p-type silicon substrate 22 through the silicon oxide and nitride films 41 and 42. Thereafter, the insulating film 28 made of silicon nitride is formed along the side wall of the trench 27a. In short, silicon nitride film is formed on the surface of the oxide film 43, including the inner surface of the trench 27a, and it is anisotropy-etched to leave the silicon nitride insulating film 28 along the side wall of the trench 27a.

Figure 3B:
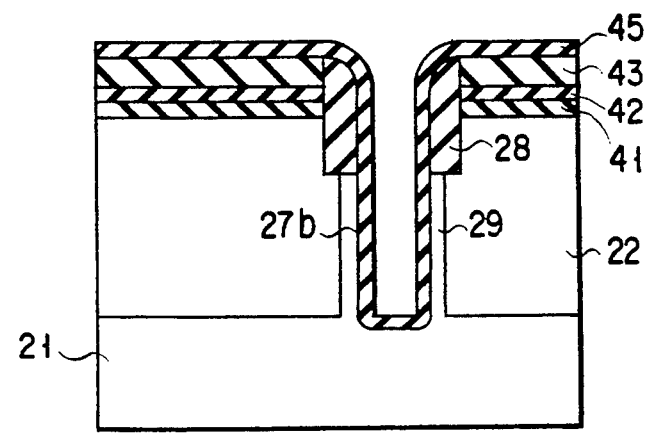

As shown in FIG. 3B, a trench 27b is further formed extending from the trench 27a into the silicon substrate 21 through the silicon substrate 22. An oxide film 45 including n-type impurities is then deposited on the surface of the oxide film 43, including the side walls of the trenches 27a and 27b. The diffusion layer 29 which serves as capacitor electrode is formed in the silicon substrate 22 along the side wall of the trench 27b by the thermal diffusion.

Figure 3C:
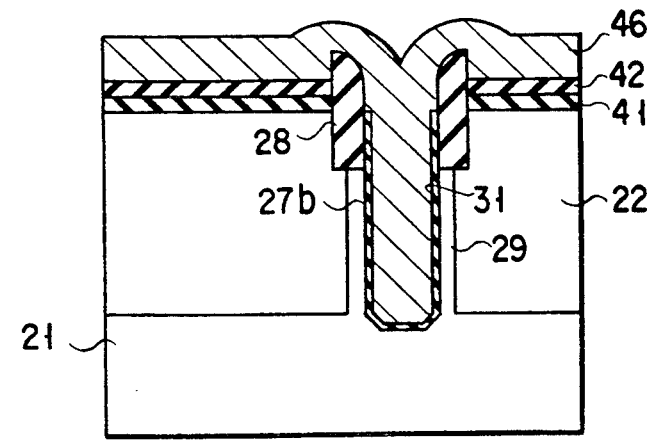

Thereafter, oxide films 45 and 43 removed by etching and capacitor insulating film 31 is deposited on the inner surfaces of the trench 27b and the insulating film 28 by a CVD method, for example. As shown in FIG. 3C, a polycrystal silicon film 46 is deposited in the trenches 27a, 27b and on the silicon nitride film 42.

Figure 3D:
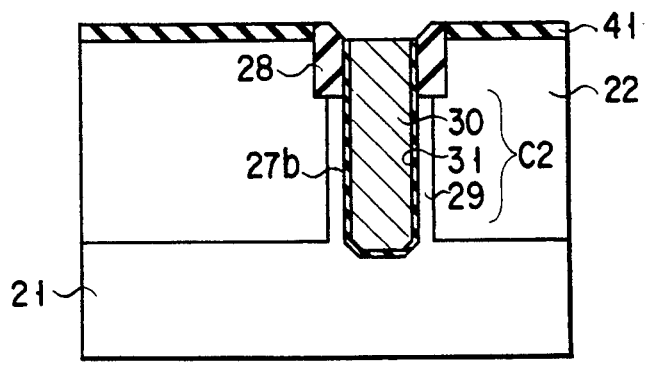

As shown in FIG. 3D, the polycrystal silicon film 46 is etched to form the storage electrode 30 in the trenches 27a and 27b. In addition, the silicon nitride film 42 is removed.

Figure 3E:
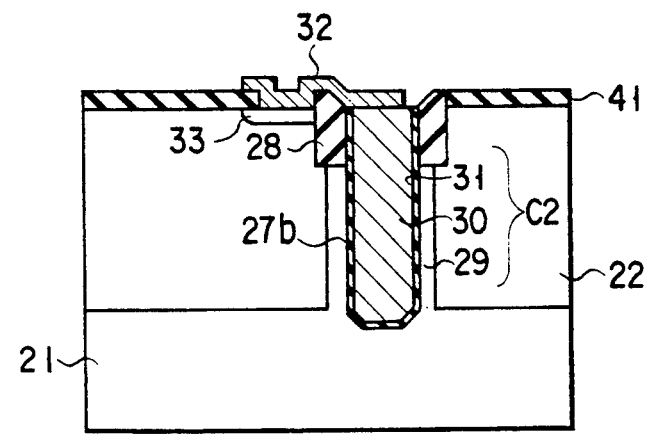

As shown in FIG. 3E, part of the silicon oxide film 41 which is contacted with the insulating film 28 is removed, and the diffusion layer 33 is formed adjacent to the insulating film 28 and in the silicon substrate 22. The electrode 32 is then formed to connect the diffusion layer 33 to the storage electrode 30.

Figure 3F:
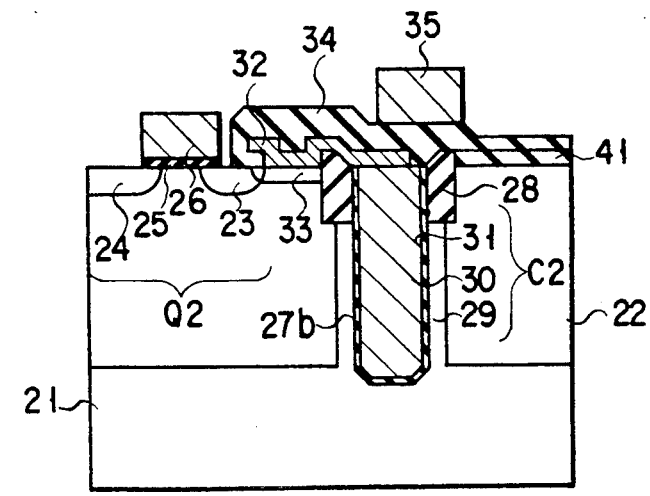

As shown in FIG. 3F, the insulating layer 34 is formed on the electrode 32 and the storage electrode 30. The MOS transistor Q2 which serves as a transfer gate is then formed according to the well-known manner. This MOS transistor includes diffusion layers 23, 24 and the gate which serves as the word line, and the diffusion layer 23 is connected to the diffusion layer 33.

The insulating layer 36 is then deposited on the whole of this structure, as shown in FIG. 2. The bit line 37 is arranged on the insulating layer 36 and connected to the diffusion layer 24 of the MOS transistor Q2.

According to the arrangement as described above, the diffusion layer 29 which serves as the capacitor electrode is formed from the outside wall of the trench 27b into the silicon substrate 22 by the thermal diffusion and the extremely thin capacitor insulating layer 31 is formed on that inner surface of the diffusion layer 29 which defines the side wall of the trench 27b. Therefore, almost all of the inside of the trench 27b can be used to form the storage electrode 30. This enables the surface area of the storage electrode to be made larger, as compared with conventional cases where a capacitor is formed in the trench.

More specifically, the diameter of the lower trench portion 27b can be made 0.3 μm when the inner diameter of the upper trench portion 27a is 0.4 μm and the thickness of the insulating film 28 made of silicon nitride is 0.05 μm. This diameter of the lower trench portion 27b becomes substantially the outer diameter of the storage electrode. The surface area of the capacitor can be made about three times, as compared with the above described conventional case where the diameter of the storage electrode is about 0.1 μm.

The insulating film 28 may be a laminated film which is formed by laminating a silicon nitride film and a silicon oxide film, for example.

Although the p-type silicon substrate 22 is arranged on the n-type silicon substrate 21 and the capacitor C2 is formed in the silicon substrate 22, it may be arranged, for example, that a p-type well is formed in the n-type silicon substrate 21 and that the capacitor C2 is formed in this well.

FIG. 4 shows a second embodiment of the present invention.

The lower trench portion 27b have the same inner diameter as that of the insulating film 28 on the upper trench portion 27a in the first embodiment shown in FIG. 2, but the diameter of the lower trench portion 27b can be made larger than that of the insulating film 28. When the silicon substrate 22 is isotropy-etched after the lower trench portion 27b is formed, as shown in FIG. 4, the diameter of the lower trench portion 27b can be made larger. When it is made larger in this manner, the surface area of the capacitor can be increased to a further extent.

FIG. 5 shows a third embodiment of the present invention.

The storage electrode 30 is connected to the diffusion layer 23 of the MOS transistor Q2 via the electrode 32 and the diffusion layer 33 in the first embodiment shown in FIG. 2. In the case of the third embodiment, however, an opening 28a is formed at a part of the insulating film 28 made of silicon nitride and the storage electrode 30 is connected to the diffusion layer 23 of the MOS transistor Q2 via that connecting part of the storage electrode 30 which fills the opening 28a, as shown in FIG. 5. When arranged in this manner, the area occupied by the memory cell can be made smaller to make the device more highly integrated.

FIG. 6 shows a fourth embodiment of the present invention.

A p-type silicon substrate 51 is used in this case. A trench 52 is formed in the p-type silicon substrate 51 and an n-type region 53 is formed while radiating phosphorus ions to the substrate 51 almost perpendicularly to the surface thereof so as to ion-implant phosphorus, which is an n-type impurity, into the silicon substrate 51 through the trench 52. The insulating film 28 and the diffusion layer 29 are then formed in the same manner as in the case of the first embodiment. The diffusion layer 29 is connected to the n-type region 53. The impurity concentration of the region 53 is higher than that of the diffusion layer 29. This embodiment can achieve the same effect as that achieved by the first embodiment.

FIG. 7 shows a fifth embodiment of the present invention.

A p-type silicon substrate 61 is used as seen in the case of the fourth embodiment. A first n-type well 62 is formed in the p-type silicon substrate 61 and a second p-type well 63 is further formed in the first well 62. The capacitor C2 and the MOS transistor Q2 are formed in the second well 63 as seen in the case of the first embodiment, and the first well 62 is connected to a reference potential $V_pl$ for the capacitor. According to this fifth embodiment, the same effect as in the case of the first embodiment can be attained.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor memory device comprising:
a first layer made of a semiconductor of a first conductivity type;
a second layer, on which said first layer is formed, made of a semiconductor of a second conductivity type and connected to a reference potential;
a trench formed in said first layer and extending from a top surface of said first layer substantially down to a top surface of said second layer, said trench comprising an upper trench portion including a bottom wall and a side wall, and a lower trench portion including a bottom wall and a side wall, said lower trench portion formed in said bottom wall of said upper trench portion and said upper trench portion having a diameter larger than a diameter of said lower trench portion;
a first insulating film covering said bottom wall and said side wall of said upper trench portion;
a second insulating film covering said bottom wall and said side wall of said lower trench portion and an inner surface of said first insulating film, said second insulating film having a thickness smaller than a thickness of said first insulating film;
an impurity diffusion layer of the second conductivity type formed in said first layer, said impurity diffusion layer completely surrounding said side wall of said lower trench portion, extending from said second layer to said bottom wall of said upper trench portion, and serving as a capacitor electrode;
a conductive body contained in said trench and serving gas a storage electrode;
a transfer MOSFET arranged on said first layer;
connecting means for connecting one of a source and a drain of said transfer MOSFET to said conductive body;
a bit line connected to the other of said source and said drain of said transfer MOSFET; and
a word line connected to a gate of said transfer MOSFET.

2. The device according to claim 1, wherein said impurity diffusion layer has a thickness smaller than the thickness of said first insulating film.

3. The device according to claim 2, wherein said second insulating film extends substantially to said top surface of said first layer.

4. The device according to claim 3, wherein said first layer is formed of a first semiconductor substrate of the first conductivity type, and said second layer is formed of a second semiconductor substrate of the second conductivity type.

5. The device according to claim 3, wherein said second layer is formed of a substrate, and said first layer is formed of a well formed in said substrate.

6. The device according to claim 2, wherein said connecting means comprises an electrode made of a material selected from a group consisting of metal, metal silicide, and polycrystal silicon.

7. The device according to claim 3, wherein an opening is formed at tops of said first insulating film and said second insulating film and part of said conductive body which fills said opening serves as said connecting means.

8. A semiconductor memory device comprising:

a first layer made of a semiconductor of a first conductivity type;

a second layer, on which said first layer is formed, made of a semiconductor of a second conductivity type and connected to a reference potential;

a trench formed in said first layer and extending from a top surface of said first layer substantially down to a top surface of said second layer, said trench comprising an upper trench portion including a bottom wall and a side wall, and a lower trench portion including a bottom wall and a side wall, said lower trench portion formed in said bottom wall of said upper trench portion and said upper trench portion having a diameter larger than a diameter of said lower trench portion;

a first insulating film covering said bottom wall and said side wall of said upper trench portion;

a second insulating film covering said bottom wall and said side wall of said lower trench portion and an inner surface of said first insulating film, said second insulating film having a thickness smaller than a thickness of said first insulating film;

an impurity diffusion layer of the second conductivity type formed in said first layer, said impurity diffusion layer completely surrounding said side wall of said lower trench portion, extending from said second layer to said bottom wall of said upper trench portion, and serving as a capacitor electrode; and a conductive body contained in said trench and serving gas a storage electrode.

9. The device according to claim 8, wherein said impurity diffusion layer has a thickness smaller than the thickness of said first insulating film.

10. The device according to claim 9, wherein said second insulating film extends substantially to said top surface of said first layer.

11. The device according to claim 10, wherein said first layer is formed of a first semiconductor substrate of the first conductivity type, and said second layer is formed of a second semiconductor substrate of the second conductivity type.

12. The device according to claim 10, wherein said second layer is formed of a substrate, and said first layer is formed of a well formed in said substrate.

* * * * *